(12) United States Patent
Gao

(10) Patent No.: US 11,606,885 B2
(45) Date of Patent: Mar. 14, 2023

(54) COMPOSITE MULTIPLE CHANNEL LIQUID COMPONENT FOR LIQUID COOLED ELECTRONICS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/137,198

(22) Filed: Dec. 29, 2020

(65) Prior Publication Data

US 2022/0210953 A1    Jun. 30, 2022

(51) Int. Cl.
    *H05K 7/20* (2006.01)
(52) U.S. Cl.
    CPC ..... *H05K 7/20781* (2013.01); *H05K 7/20254* (2013.01)
(58) Field of Classification Search
    None
    See application file for complete search history.

(56) References Cited

U.S. PATENT DOCUMENTS

| | | | | |
|---|---|---|---|---|
| 8,203,842 B2* | 6/2012 | Campbell | .......... | H05K 7/20772 |
| | | | | 165/80.4 |
| 8,934,250 B2* | 1/2015 | Campbell | ................ | H05K 7/20 |
| | | | | 257/714 |
| 10,905,031 B1* | 1/2021 | Gao | ........................ | G06F 1/184 |
| 10,917,998 B2* | 2/2021 | Shelnutt | ............. | H05K 7/20772 |
| 11,044,835 B2* | 6/2021 | Chiu | .................. | H05K 7/20309 |
| 11,129,292 B1* | 9/2021 | Shao | .................. | H05K 7/20772 |
| 11,252,844 B2* | 2/2022 | Shao | .................. | H05K 7/20781 |
| 2020/0275579 A1* | 8/2020 | Gao | ........................ | H05K 7/18 |
| 2021/0084796 A1* | 3/2021 | Gao | .................. | H05K 7/20818 |

* cited by examiner

*Primary Examiner* — Courtney L Smith
(74) *Attorney, Agent, or Firm* — Womble Bond Dickinson (US) LLP

(57) ABSTRACT

Disclosed are liquid cooling devices for high power density electronics. The liquid cooling devices may include multiple integrated cooling channels for cooling the electronics in various configurations of the cooling channels and fluid distribution paths. A fluid input port and a fluid output port are connected to the supply and return loops of an external cooling source to distribute cooling liquid to the electronics and to return the liquid. The fluid input port may be connected to an inlet channel that distributes the cooling liquid to multiple inlets of the multiple integrated channels. The fluid output port may be connected to an outlet channel that provides a converging channel for the fluid existing from the multiple integrated channels. The multiple cooling fins and channels, inlet channel, outlet channel, fluid inlet port, and fluid outlet port may be integrated into multiple frames that are stacked to assemble the liquid cooling device.

19 Claims, 14 Drawing Sheets

COMPOSITE MULTIPLE CHANNEL LIQUID COMPONENT FOR LIQUID COOLED ELECTRONICS

FIELD OF THE INVENTION

Embodiments of the present invention relate generally to data center cooling. More particularly, embodiments of the invention relate to designs of liquid cooling devices with multiple integrated channels for cooling multiple electronic components with high power density.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the thermal environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

A robust cooling solution is also critical for thermal management of high power density electronics in other applications. For example, cloud and edge computing will increasingly be used in combination with 5G technology. Especially in edge computing, more computational and storage resources may need to be located closer to the end users instead of relying on a core data center or a centralized cloud environment. One such application is edge computing for autonomous vehicles. On an autonomous vehicle, multiple sensors are assembled on the vehicle. The data collected by these sensors may be computed locally using computing hardware on the vehicle. As more sophisticated features and ever stringent accuracy requirements are added to the autonomous vehicle system, computing and storage resources of the on-vehicle hardware are also increasing, yielding higher power density and higher heat density that require improved thermal management solutions.

One complication of cooling servers and other high performance electronic components such as central processing units (CPU), graphical processing units (GPU), etc., is that multiple chips or boards are usually tightly packaged to yield very high power and heat densities. Air cooling may not provide sufficient cooling capacity and liquid cooling may be needed. However, liquid cooling is often challenging because of the limited space in complex packaging environment and the potential reliability issue associated with the liquid piping. For example, connecting points between the fluid ports and the hoses of the fluid piping and distribution network may be vulnerable to leaks. The design of the liquid cooling devices and the internal fluid management of the fluid distribution network may also involve challenging engineering analysis and design tradeoff considerations. For example, higher flow resistance of the fluid within the liquid cooling devices may enable better heat transfer coefficient but at the expense of larger operating power consumption. A rigid design may not be flexibly adapted and scaled to meet the ever stringent thermal management needs of a high performance and power density environment. Thus, there is a need to for a liquid cooling design that is scalable, reliable, efficient, serviceable, and low cost to meet the thermal management needs of high performance electronic components in complex packaging environment.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
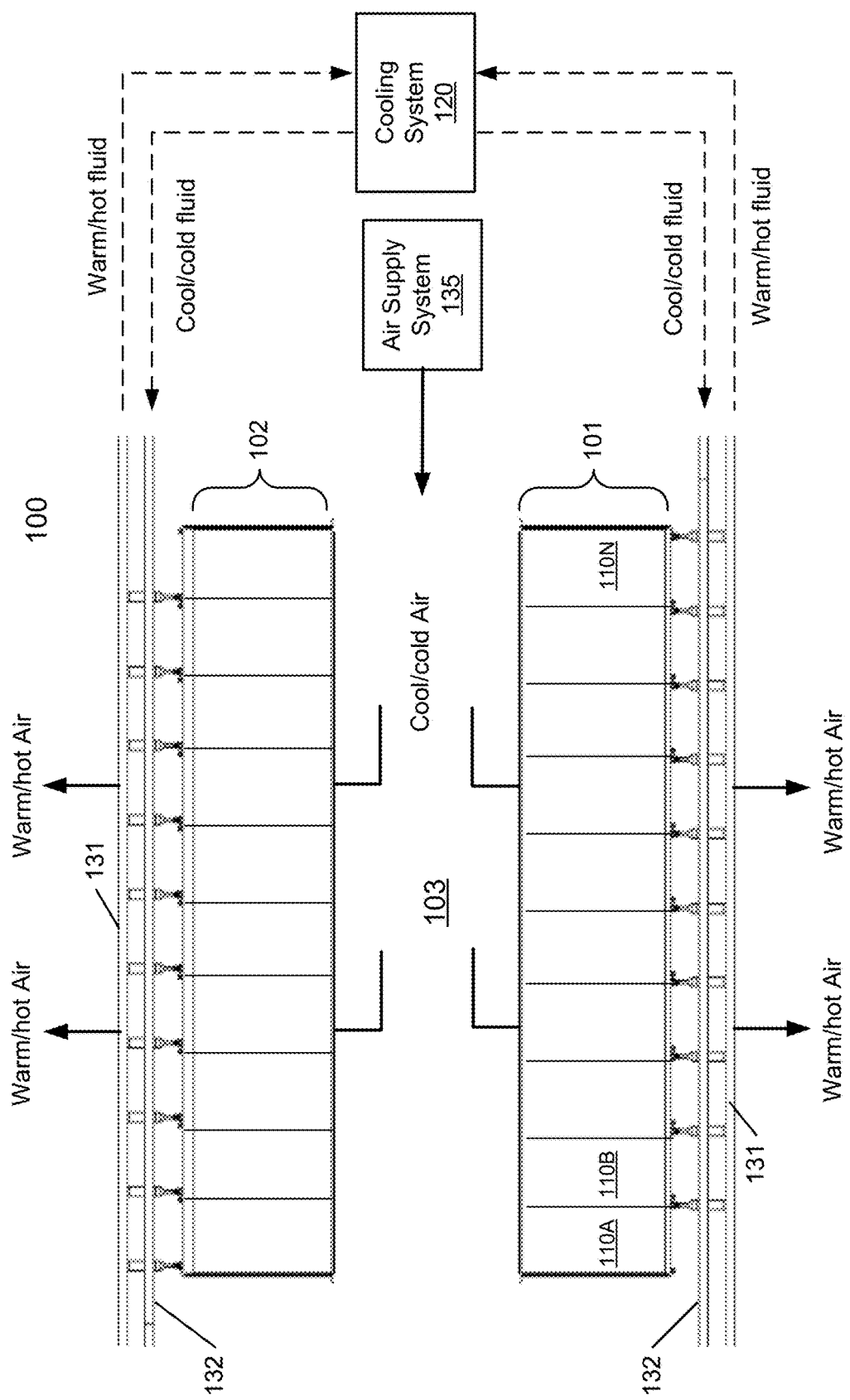
FIG. 1 is a block diagram illustrating an example of a data center facility according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Disclosed are designs of devices for liquid cooling of high power density electronics. The liquid cooling devices may include multiple integrated cooling channels for cooling the electronics in various configurations of the cooling channels and fluid distribution paths. A fluid input port and a fluid output port are connected to the supply and return loops of an external cooling source to distribute cooling liquid to the electronics and to return the liquid. The fluid input port may be connected to an inlet channel that distributes the cooling liquid to multiple inlets of the multiple integrated channels. The fluid output port may be connected to an outlet channel that provides a converging channel for the fluid existing from the multiple integrated channels. The integrated channels may have fin structures to provide increased surface area to facilitate air cooling of the heated fluid. Different layouts and packaging of the fluid input port, fluid output port, and the cooling channels enable a liquid cooling device to be optimized for electronic components or systems with different thermal profiles. The designs of the liquid cooling devices and the fluid distribution network provide efficient liquid cooling of multiple high-density electronics packaged in a small footprint, such as multiple high-density chips on the same board, increasing cooing performance, reliability, efficiency, scalability, and lowering cost to meet the thermal management needs of high performance electronic components in complex packaging environment.

In one embodiment, a liquid cooling device includes an array of cooling channels used to transport a liquid. A supply channel is connected to the array of cooling channels to distribute the liquid to the cooling channels. A return channel is connected to the array of cooling channels to collect the liquid existing from the cooling channels. A fluid inlet port is connected to the supply channel to supply the liquid from a cooling liquid source to the supply channel. A fluid outlet port is connected to the return channel to return the liquid to the cooling liquid source. An array of cold plates is designed to make contact with an array of electronic components and to remove heat generated by the electronic components through the liquid. The array of cooling channels, supply channel, return channel, fluid inlet port, fluid outlet port, and the array of cold plates are integrated into multiple frames that are stacked to assemble the liquid cooling device.

In one embodiment, the fluid inlet port is designed to run through the multiple stacked frames on one side of the array of cooling channels to supply the liquid to the supply channel. Similarly, the fluid outlet port is designed to run through the multiple stacked frames on an opposite side of the array of cooling channels to return the liquid. The supply channel is designed to distribute the liquid to the array of cooling channels from the same side as the fluid inlet port. The return channel is designed to collect the liquid from the array of cooling channels from the same side as the fluid outlet port.

In one embodiment, the fluid inlet port is designed to run through the multiple stacked frames on one side of the array of cooling channels to supply the liquid to the supply channel. The fluid outlet port is designed to return the liquid from above the array of cooling channels. The return channel includes an array of individual return channels that are stacked above the array of cooling channels to collect the liquid from the individual cooling channels. The return channel also includes a converging channel stacked above the array of individual return channels to collect the liquid from the return channels. The fluid outlet port is designed to be situated above the converging channel to return the liquid. A first frame of the stacked frames may integrate the array of cooling channels and the array of cold plates. A second frame of the stacked frames may integrate the array of individual cooling channels. A third frame of the stacked frames may integrate the converging channel and the fluid outlet port.

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes one or more rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied. For example, two rows of electronic racks may back to back face each other without forming an aisle in between, while their frontends face away from each other. The backends of the electronic racks may be coupled to the room cooling liquid manifolds.

In one embodiment, each of the electronic racks (e.g., electronic racks 110A-110N) includes a housing to house a number of IT components arranged in a stack operating therein. The electronic racks can include a cooling liquid manifold, a number of server slots (e.g., standard shelves or chassis configured with an identical or similar form factor), and a number of server chassis (also referred to as server blades or server shelves) capable of being inserted into and removed from the server slots. Each server chassis represents a computing node having one or more processors, a memory, and/or a persistent storage device (e.g., hard disk), where a computing node may include one or more servers operating therein. At least one of the processors is attached to a liquid cold plate (also referred to as a cold plate assembly) to receive cooling liquid. In addition, one or more optional cooling fans are associated with the server chassis to provide air cooling to the computing nodes contained therein. Note that the cooling system 120 may be coupled to multiple data center systems such as data center system 100.

In one embodiment, cooling system 120 includes an external liquid loop connected to a cooling tower or a dry cooler external to the building/housing container. The cooling system 120 can include, but is not limited to evaporative cooling, free air, rejection to large thermal mass, and waste heat recovery designs. Cooling system 120 may include or be coupled to a cooling liquid source that provide cooling liquid.

In one embodiment, each server chassis is coupled to the cooling liquid manifold modularly, such that a server chassis can be removed from the electronic rack without affecting the operations of remaining server chassis in the electronic rack and the cooling liquid manifold. In another embodiment, each server chassis is coupled to the cooling liquid manifold through a quick-release coupling assembly having a server liquid intake connector and a server liquid outlet connector coupled to a flexible hose to distribute the cooling liquid to the processors. The server liquid intake connector is to receive cooling liquid via a rack liquid intake connector from a cooling liquid manifold mounted on a backend of the electronic rack. The server liquid outlet connector is to emit warmer or hotter liquid carrying the heat exchanged from the processors to the cooling liquid manifold via a rack liquid outlet connector and then back to a coolant distribution unit (CDU) within the electronic rack.

In one embodiment, the cooling liquid manifold disposed on the backend of each electronic rack is coupled to liquid supply line 132 (also referred to as a room supply manifold) to receive cooling liquid from cooling system 120. The cooling liquid is distributed through a liquid distribution loop attached to a cold plate assembly on which a processor is mounted to remove heat from the processors. A cold plate is configured similar to a heat sink with a liquid distribution tube attached or embedded therein. The resulting warmer or hotter liquid carrying the heat exchanged from the processors is transmitted via liquid return line 131 (also referred to as a room return manifold) back to cooling system 120.

Liquid supply/return lines 131-132 are referred to as data center or room liquid supply/return lines (e.g., global liquid supply/return lines), which supply cooling liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server chassis in the electronic rack to deliver the cooling liquid to the cold plates of the processors.

In one embodiment, data center system 100 further includes an optional airflow delivery system 135 to generate an airflow to cause the airflow to travel through the air space of the server chassis of the electronic racks to exchange heat generated by the computing nodes due to operations of the computing nodes (e.g., servers) and to exhaust the airflow exchanged heat to an external environment or a cooling system (e.g., air-to-liquid heat exchanger) to reduce the temperature of the airflow. For example, air supply system 135 generates an airflow of cool/cold air to circulate from aisle 103 through electronic racks 110A-110N to carry away exchanged heat.

The cool airflows enter the electronic racks through their frontends and the warm/hot airflows exit the electronic racks from their backends. The warm/hot air with exchanged heat is exhausted from room/building or cooled using a separate cooling system such as an air-to-liquid heat exchanger. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling.

Figure 2:
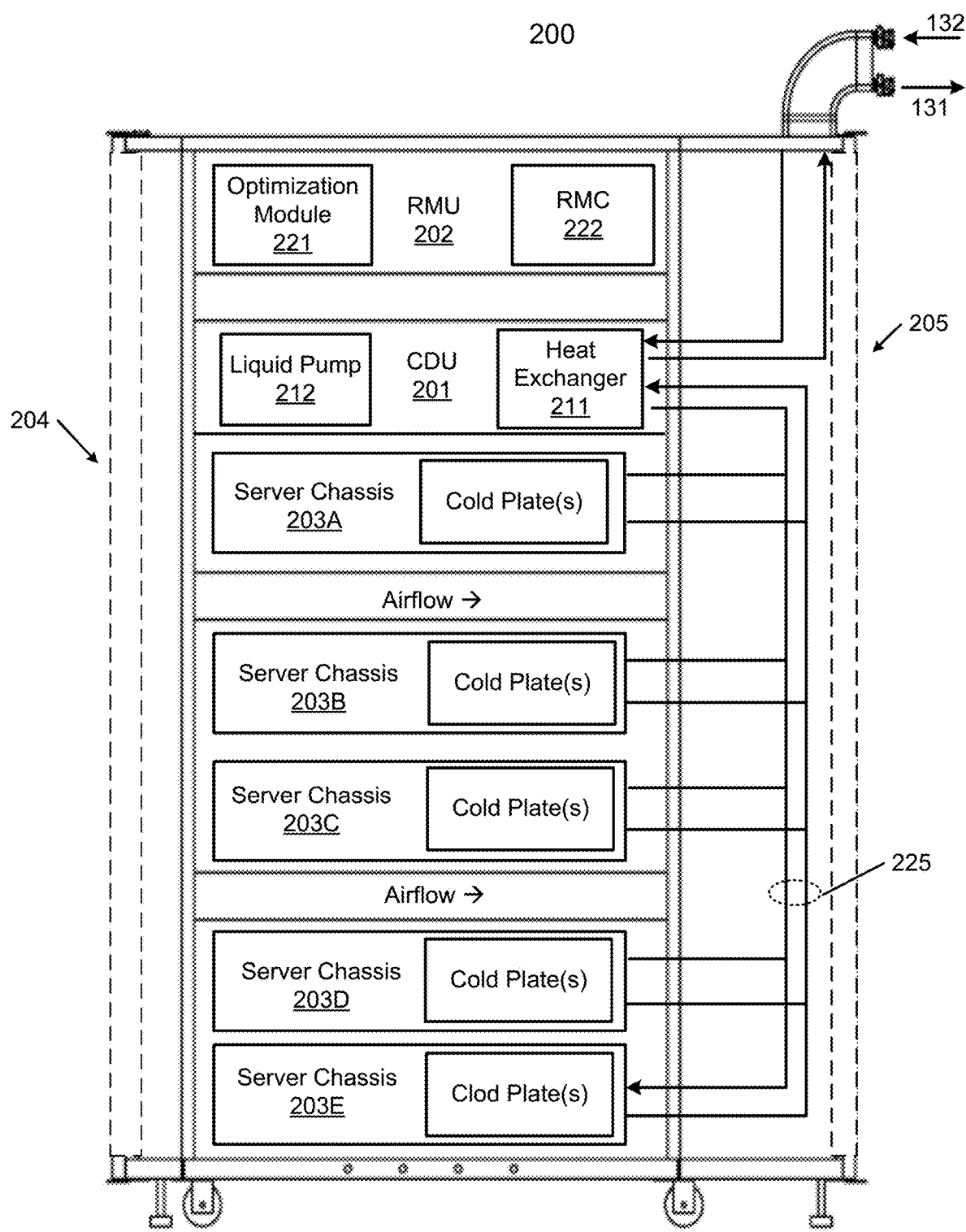
FIG. 2 is a block diagram illustrating an example of an electronic rack according to one embodiment.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, CDU 201, rack management unit (RMU) 202, and one or more server chassis 203A-203E (collectively referred to as server chassis 203). Server chassis 203 can be inserted into an array of server slots (e.g., standard shelves) respectively from frontend 204 or backend 205 of electronic rack 200. Note that although there are five server chassis 203A-203E shown here, more or fewer server chassis may be maintained within electronic rack 200. Also note that the particular positions of CDU 201, RMU 202, and/or server chassis 203 are shown for the purpose of illustration only; other arrangements or configurations of CDU 201, RMU 202, and/or server chassis 203 may also be implemented. In one embodiment, electronic rack 200 can be either open to the environment or partially contained by a rack container, as long as the cooling fans can generate airflows from the frontend to the backend.

In addition, for at least some of the server chassis 203, an optional fan module (not shown) is associated with the server chassis. Each of the fan modules includes one or more cooling fans. The fan modules may be mounted on the backends of server chassis 203 or on the electronic rack to generate airflows flowing from frontend 204, traveling through the air space of the sever chassis 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, may be coupled to cooling system 120 as described above.

In addition, heat exchanger 211 further includes a second loop with two ports having a second pair of liquid connectors coupled to liquid manifold 225 (also referred to as a rack manifold) to form a secondary loop, which may include a supply manifold (also referred to as a rack liquid supply line or rack supply manifold) to supply cooling liquid to server chassis 203 and a return manifold (also referred to as a rack liquid return line or rack return manifold) to return warmer liquid back to CDU 201. Note that CDUs 201 can be any kind of CDUs commercially available or customized ones. Thus, the details of CDUs 201 will not be described herein.

Each of server chassis 203 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 200 further includes optional RMU 202 configured to provide and manage power supplied to servers 203, and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and the fan modules. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by fan modules and liquid pump 212, which may be proportional to their respective speeds. These operating data are referred to as real-time operating data. Note that the monitor may be implemented as a separate module within RMU 202.

Based on the operating data, optimization module 221 performs an optimization using a predetermined optimization function or optimization model to derive a set of optimal fan speeds for fan modules and an optimal pump speed for liquid pump 212, such that the total power consumption of liquid pump 212 and fan modules reaches minimum, while the operating data associated with liquid pump 212 and cooling fans of the fan modules are within their respective designed specifications. Once the optimal pump speed and optimal fan speeds have been determined, RMC 222 configures liquid pump 212 and cooling fans of fan modules based on the optimal pump speeds and fan speeds.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server chassis 203. Similarly, based on the optimal fan speeds, RMC 222 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown in FIG. 2 is shown and described for the purpose of illustration only; other configurations or arrangements may also be applicable. For example, CDU 201 may be an optional unit. The cold plates of server chassis 203 may be coupled to a rack manifold, which may be directly coupled to room manifolds 131-132 without using a CDU. Although not shown, a power supply unit may be disposed within electronic rack 200. The power supply unit may be implemented as a standard chassis identical or similar to a sever chassis, where the power supply chassis can be inserted into any of the standard shelves, replacing any of server chassis 203. In addition, the power supply chassis may further include a battery backup unit (BBU) to provide battery power to server chassis 203 when the main power is unavailable. The BBU may include one or more battery packages and each battery package include one or more battery cells, as well as the necessary charging and discharging circuits for charging and discharging the battery cells.

Figure 3:
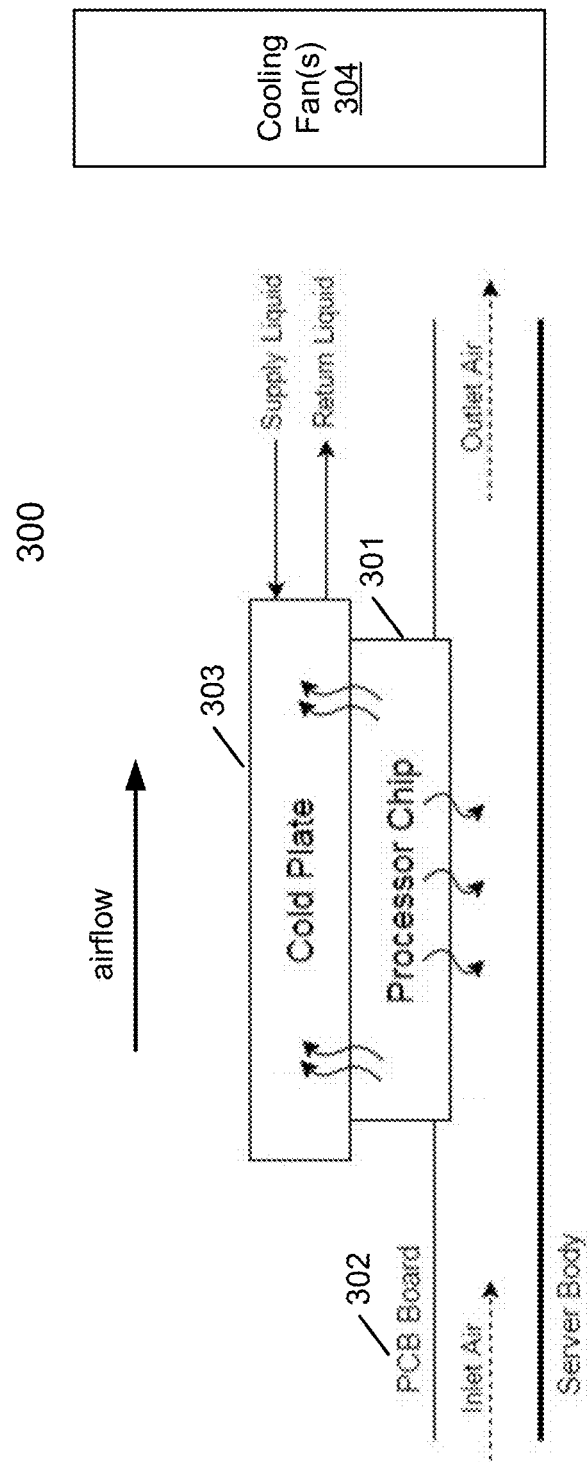
FIG. 3 is a block diagram illustrating an example of a cold plate configuration according to one embodiment.

FIG. 3 is a block diagram illustrating a processor cold plate configuration according to one embodiment. The processor/cold plate assembly 300 can represent any of the processors/cold plate structures of server chassis 203 as shown in FIG. 2. Referring to FIG. 3, processor 301 is plugged onto a processor socket mounted on printed circuit board (PCB) or motherboard 302 coupled to other electrical components or circuits of a data processing system or server. Processor 301 also includes a cold plate 303 attached to it, which is coupled to a rack manifold that is coupled to liquid supply line 132 and/or liquid return line 131. A portion of the heat generated by processor 301 is removed by the cooling liquid via cold plate 303. The remaining portion of the heat enters into an air space underneath or above, which may be removed by an airflow generated by cooling fan 304.

Figure 4:
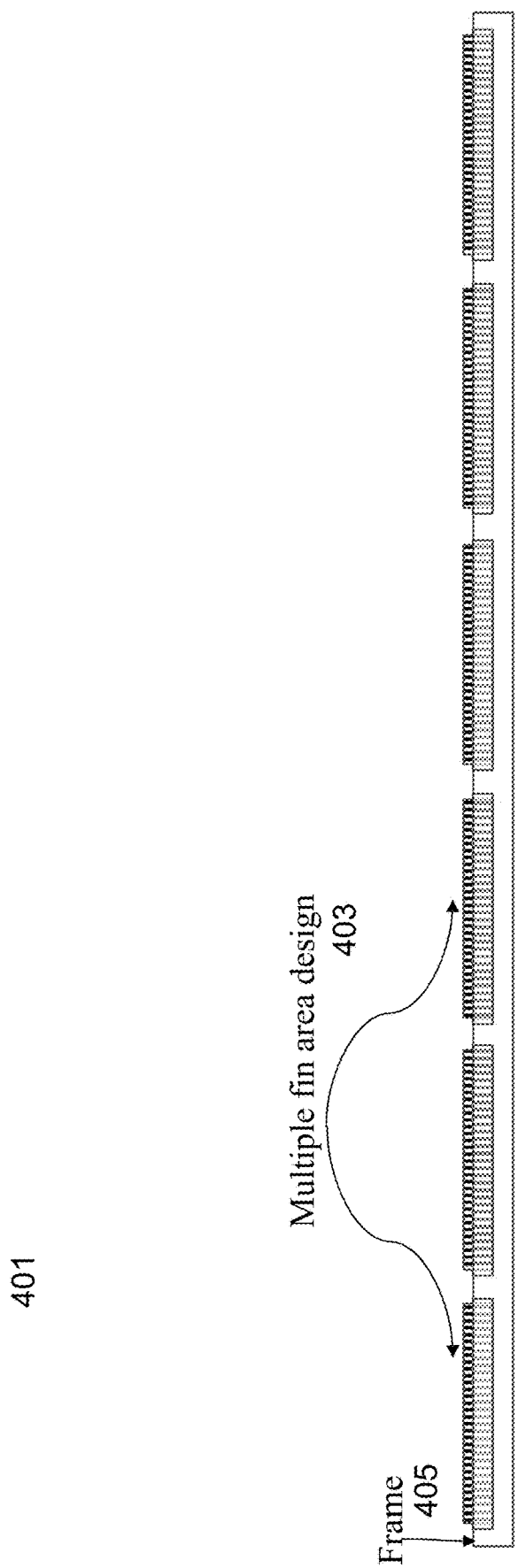
FIG. 4 shows a side view of a liquid cooling device with multiple cooling channels in one fluid distribution configuration according to one embodiment.

FIG. 4 shows a side view of a liquid cooling device 401 with multiple cooling channels in one fluid distribution configuration according to one embodiment. Liquid cooling device 401 may be integrated into any of IT equipment in the electronic racks shown in FIG. 1, such as, electronic racks 110A-110N, or electronic rack 200 of FIG. 2.

In one embodiment, liquid cooling device 401 may be part of a liquid distribution loop such as the secondary loop coupled to liquid manifold 225 of FIG. 2 used to supply cooling liquid to server blades 203 and to return warm liquid carrying heat exchanged via cold plate 303 from electronic components. Liquid cooling device 401 may have multiple cooling channels 403 integrated onto a frame 405 to provide conduits to transport the fluid. In one embodiment, cooling channels 403 may have fin structures shaped to provide flow resistance to improve fluid distribution and management efficiency. In one embodiment, the fin structures may be shaped to provide increased surface area to facilitate air cooling of the heated fluid. Cooling channels 403 with fin structures may also be referred to as fin channels or micro-channels. FIG. 4 shows frame 405 fabricated with six sets of cooling channels 403. Each set of cooling channels 403 may include multiple fin channels or micro-channels. In one embodiment, each set of cooling channels 403 may be used to flow fluid carrying heat exchanged with a cold plate. However, liquid cooling device 401 may have different numbers of sets of cooling channels 403 with different form factors and the footprints.

Figure 5:
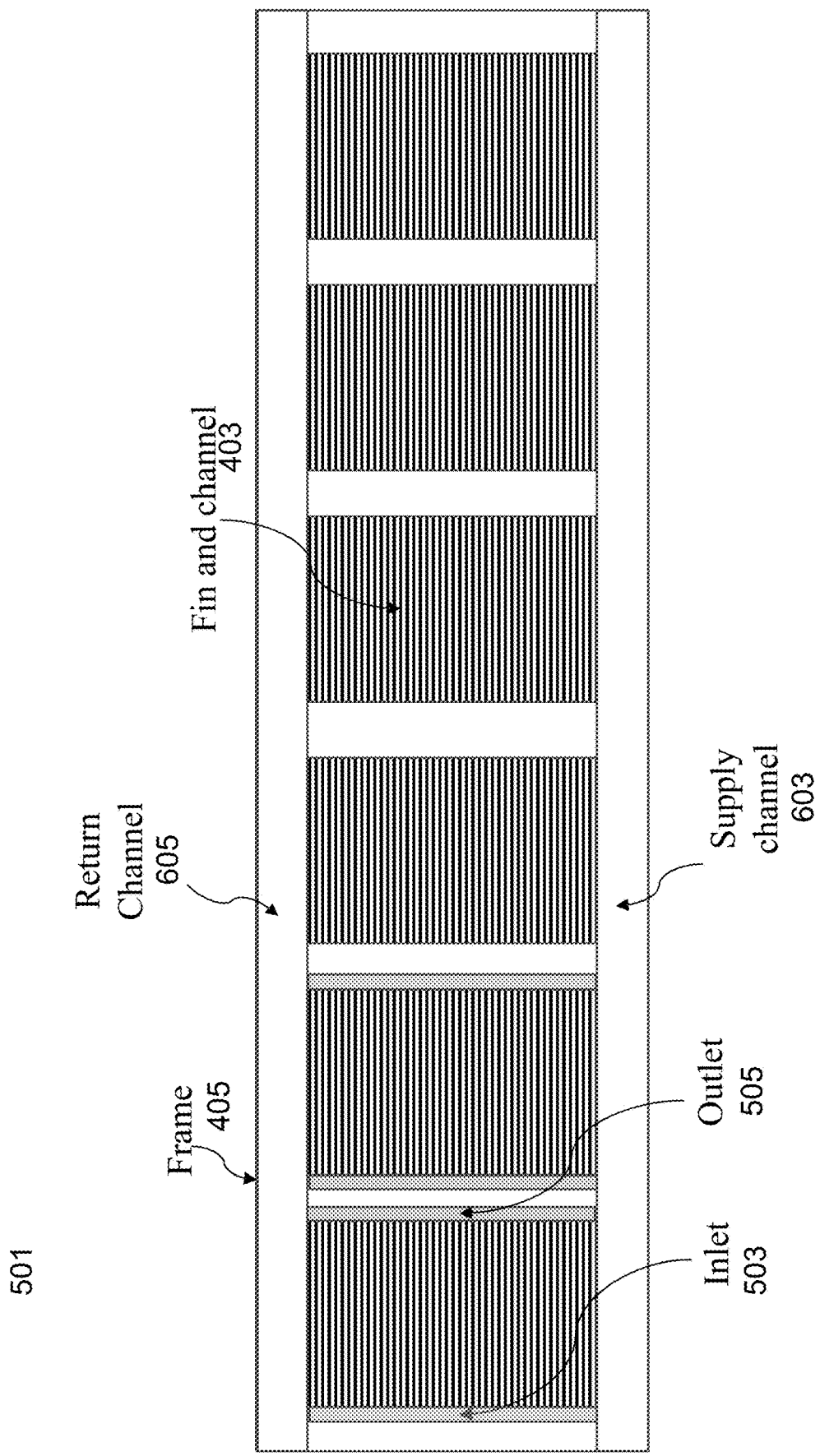
FIG. 5 shows a top view of a liquid cooling device with multiple cooling channels in one fluid distribution configuration according to one embodiment.

FIG. 5 shows a top view of a liquid cooling device 501 with multiple cooling channels in one fluid distribution configuration according to one embodiment. FIG. 5 may represent the top view of the liquid cooling device 401 of FIG. 4 fabricated with six sets of cooling channels 403 on a frame 405. Each set of cooling channel 403 may have an inlet channel 503 to provide fluid into, and an outlet channel 505 to emit fluid out of, the cooling channel 403. The inlet channel 503 and outlet channel 505 for each cooling channel 403 transports the fluid to all the fin channels or micro-channels of the cooling channel 403.

Inlet channel 503 and outlet channel 505 may connect to a fluid inlet port and a fluid outlet port (not shown), respectively, directly or indirectly. For example, a supply channel 603 may connect to inlet channel 503 of each set of cooling channels 403. Supply channel 603 may extend perpendicularly to inlet channel 503. A return channel 605 may connect to outlet channel 505 of each set of cooling channels 405. Return channel 605 may be on the opposite side of frame 405 from supply channel 603 and may extend perpendicularly to outlet channel 505. In one embedment, supply channel 603 may be connected to the fluid inlet port to distribute the fluid to each inlet channel 503 and return channel 605 may be connected to the fluid outlet port to collect the fluid from each outlet channel 505. The fluid inlet port and the fluid outlet port may supply the cooling liquid into and return the warm liquid out of the liquid cooling device 501, respectively. In one embodiment, the liquid distribution loop of the liquid cooling device 501 may be assembled using multiple frames that are stacked together to ease fabrication. Frame 405 may represent the bottom frame of the assembly located closest to the electronic components to be cooled.

Figure 6:
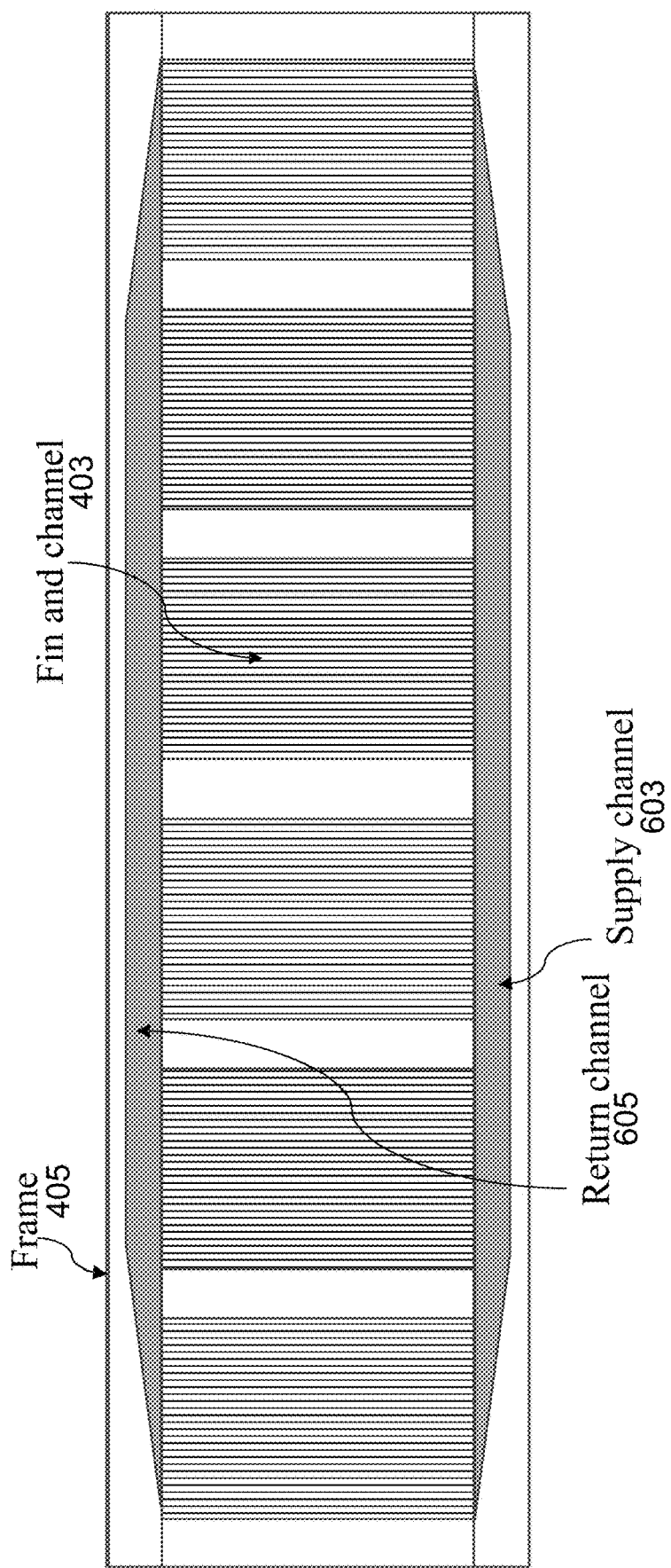
FIG. 6 shows a top view of a liquid cooling device with multiple cooling channels in a central fluid distribution configuration with the inlet and outlet channels on two sides of the cooling channels according to one embodiment.

FIG. 6 shows a top view of a liquid cooling device 601 with multiple cooling channels 405 in a central fluid distribution configuration with the inlet and outlet channels on two sides of cooling channels 405 according to one embodiment. There are again six sets of cooling channels 403 fabricated on a frame 405.

The configuration is referred to as a central fluid distribution scheme because a supply channel 603 distributes the fluid to each set of cooling channels 403 from a fluid input port (not shown). Similarly, a return channel 605 collects the fluid from each set of cooling channels 403 to return to a fluid output port. In contrast to fluid distribution configuration of FIG. 5, the inlet channel that supplies fluid into, and the outlet channel that emits fluid from, the fin channels or the micro-channels of each set of cooling channels 405 may thus be connected directly to the fluid input port and output port, respectively. Thus, supply channel 603 may also be referred to as inlet channel and return channel 605 may also be referred to as outlet channel.

In one embodiment, supply channel 603 and return channel 605 may have a trapezoid shape to control the resistance of the fluid flow or fluid pressure among the sets of cooling channels 405 to improve the fluid distribution and management efficiency. For example, if the fluid input port is located near the lengthwise midpoint of supply channel 603, the trapezoid shape may compensate for the loss of fluid pressure that otherwise would have occurred for cooling channels 405 closer to the outer edges of frame 405. The fluid flow among the set of cooling channels 405 may thus be more equally distributed. In one embodiment, supply channel 603 and return channel 605 may take on other shapes to tailor the fluid resistance or the fluid pressure through cooling channels 405 as a function of the desired fluid distribution and flow efficiency of each set of cooling channels 405.

Figure 7:
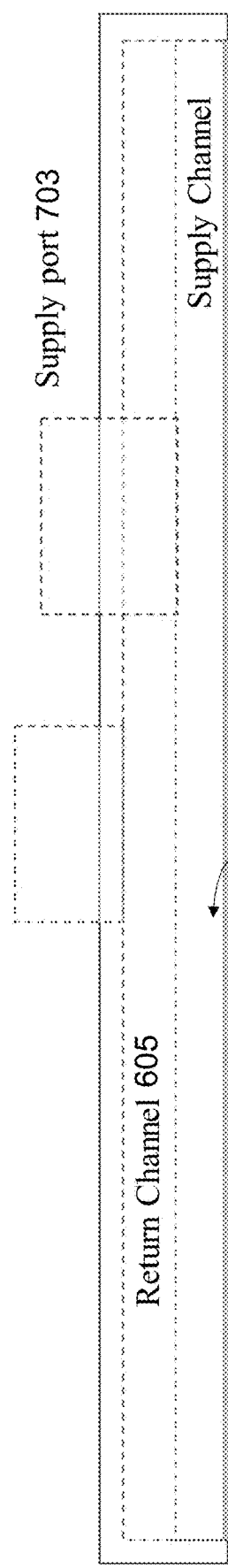
FIG. 7 shows a side view of a liquid cooling device with cooling channels in a central fluid distribution configuration with the inlet and outlet channels on two sides of the cooling channels according to one embodiment.
Figure 7:
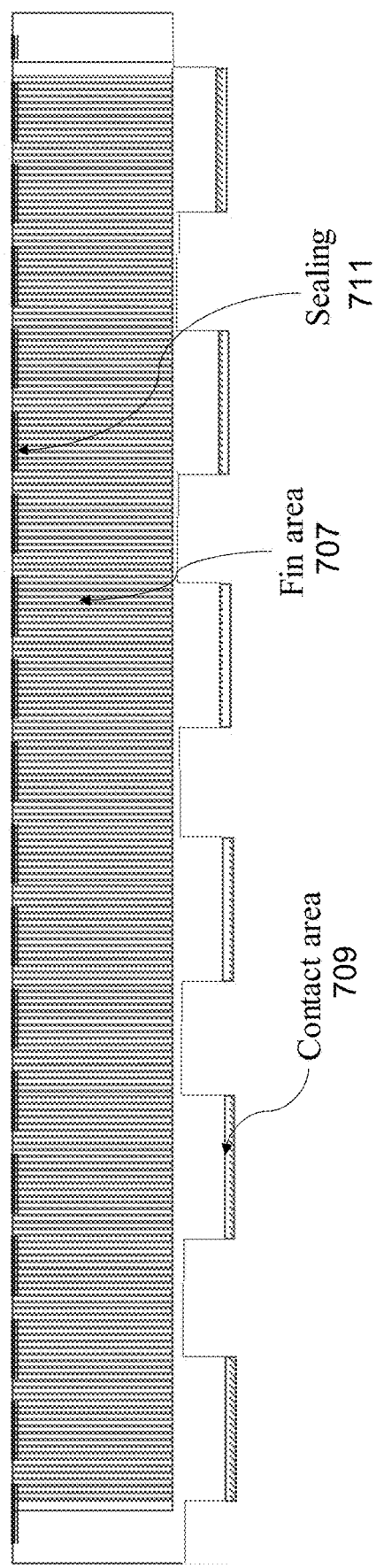

FIG. 7 shows a side view of a liquid cooling device 701 with cooling channels in a central fluid distribution configuration with the inlet and outlet channels on two sides of the cooling channels according to one embodiment. In FIG. 7, all the cooling channels are combined into a single set of fin channels or micro-channels in fin area 707. FIG. 7 may represent the cross-sectional side view of the liquid cooling device 601 of FIG. 6 in which all sets of the cooling channels have been combined.

A supply port 703 is connected to supply channel 603 to supply the fluid to the fin channels of fin area 707. Supply port 703 may also be referred to as fluid input port or fluid inlet port. A return port 705 is connected to return channel 605 to collect the fluid existing from the fin channels of fin area 707. Return port 705 may also be referred to as fluid output port or fluid outlet port. Support channel 603 and supply port 703 may be situated on one side of the fin channels to supply the fluid from a top frame to a bottom frame of liquid cooling device 701. The bottom frame may contain fin area 707. Return channel 605 and return port 705 may be located on an opposite side of the fin channels to return the heat-exchanged fluid from the bottom frame back to the top frame.

A contact area 709 of the bottom frame below fin area 707 may contain cold plates or heat sinks in contact with the electronic components or circuits such as the cold plate 303 and processor chip 301 assembly shown in FIG. 3. In one embodiment, the cold plates in contact area 709 may be immersed in the fluid to exchange heat generated by the electronic components. In one embodiment, the cold plates may have a liquid distribution tube attached or embedded therein to transport fluid through the cold plates and out to the fin channels of fin area 707. A sealing layer 711 may be deposited above fin area 707 of the bottom frame to prevent leakage of fluid from the fin channels. The top frame acts as a lid 713 to cap the fin channels when the top frame is mated to the bottom frame.

Figure 8:
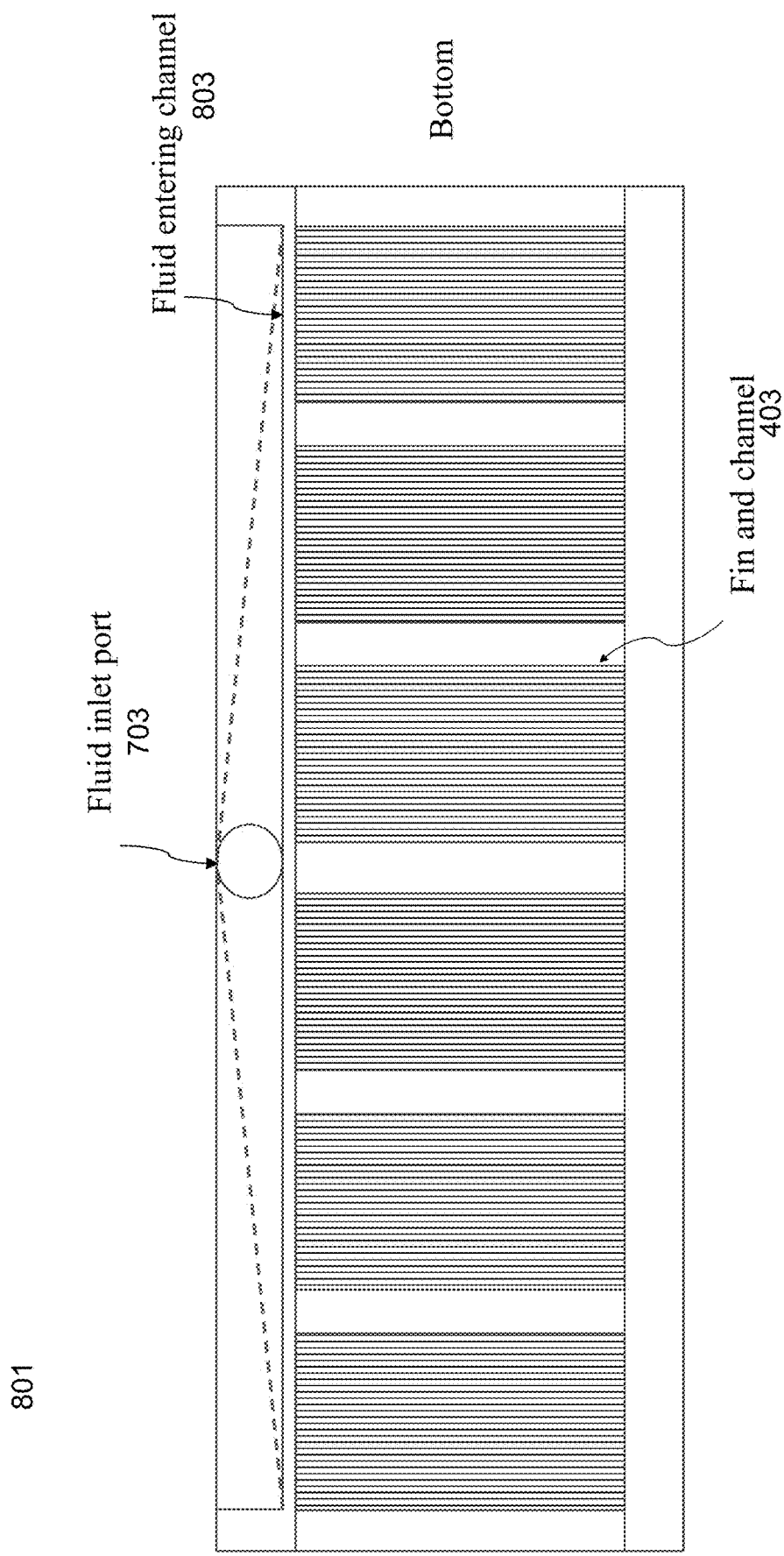
FIG. 8 shows a top view of a liquid cooling device with multiple cooling channels showing the fluid input port on one side of the cooling channels according to one embodiment.

FIG. 8 shows a top view of a liquid cooling device 801 with multiple cooling channels showing the fluid input port on one side of the cooling channels according to one embodiment. FIG. 8 shows six sets of cooling channels 403 fabricated on a bottom frame of liquid cooling device 801 in a central distribution configuration similar to liquid cooling device 601 of FIG. 6. However, in contrast to liquid cooling device 601, only the fluid inlet port 703 and fluid entering channel 803 of the inlet channel that supplies fluid to the cooling channels 403 are designed for the bottom frame. The fluid outlet port and the outlet channel that returns fluid from the cooling channels 403 are designed for the top frame as will be explained.

In one embodiment, fluid entering channel 803 may be shaped as a triangle shown by the dashed line with fluid inlet port 703 located near the midpoint of the base of the triangle. The shape of the fluid entering channel 803 may be customized for better efficiency while taking into account manufacturing complexity and cost. Fluid entering channel 803 may perform the same function as the supply channel 603 of FIG. 6. In one embodiment, fluid entering channel 803 may be shaped as a rectangle indicated by the solid line. As discussed, fluid entering channel 803 may take on other shapes to tailor the fluid resistance or the fluid pressure through the cooling channels 403 as a function of the fluid distribution and flow efficiency requirement of the cooling channels 403.

Figure 9:
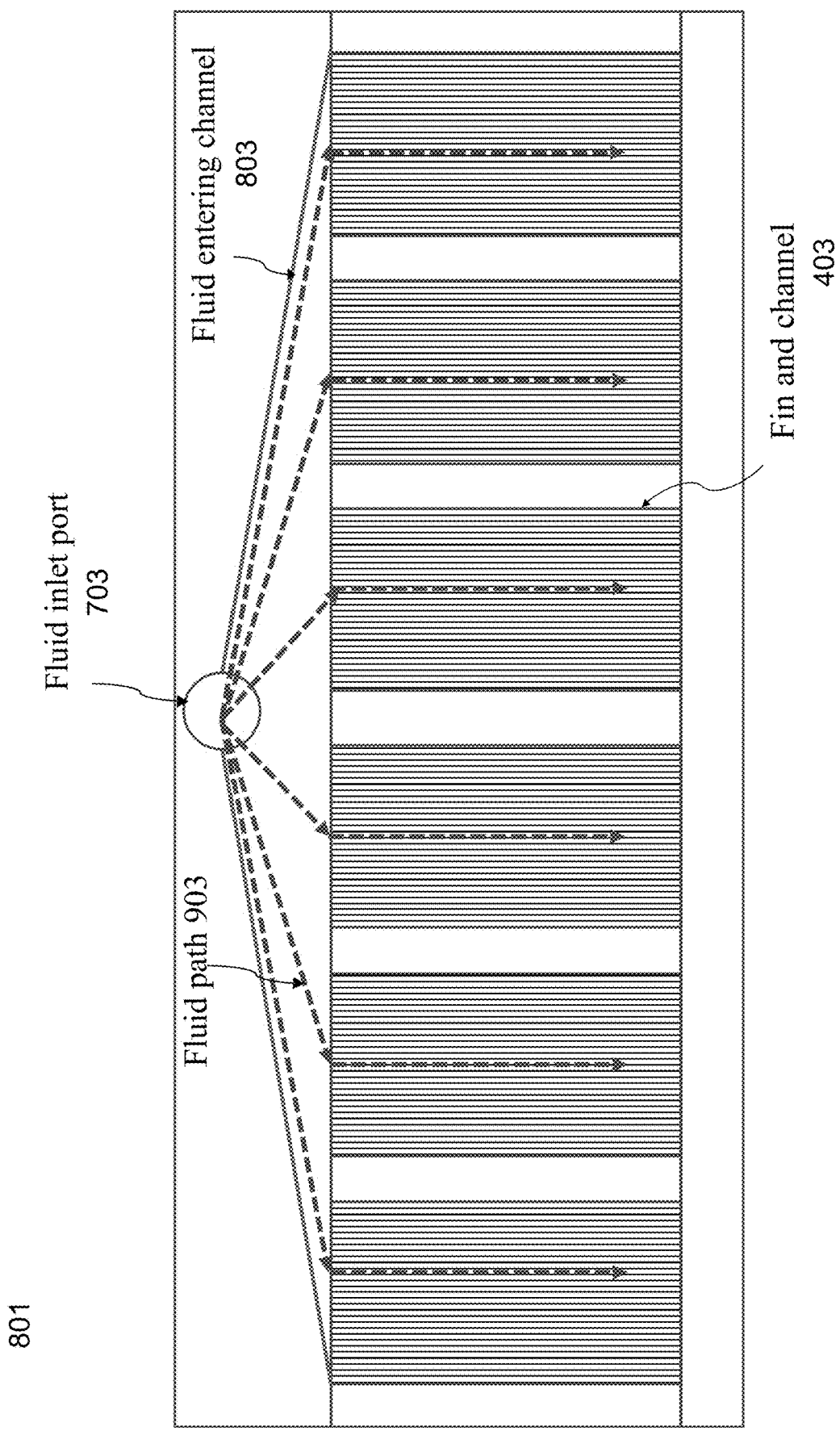
FIG. 9 shows the fluid distribution path of the liquid cooling device of FIG. 8 according to one embodiment.

FIG. 9 shows the fluid distribution path 903 of the liquid cooling device 801 of FIG. 8 according to one embodiment. The fluid supplied by fluid inlet port 703 is distributed through fluid entering channel 803 into the fin channels or micro-channels of the set of cooling channels 403. The fluid flows through the fin channels or micro-channels in the same direction and will be collected by an outlet channel or return channel for return through a fluid outlet port.

Figure 10:
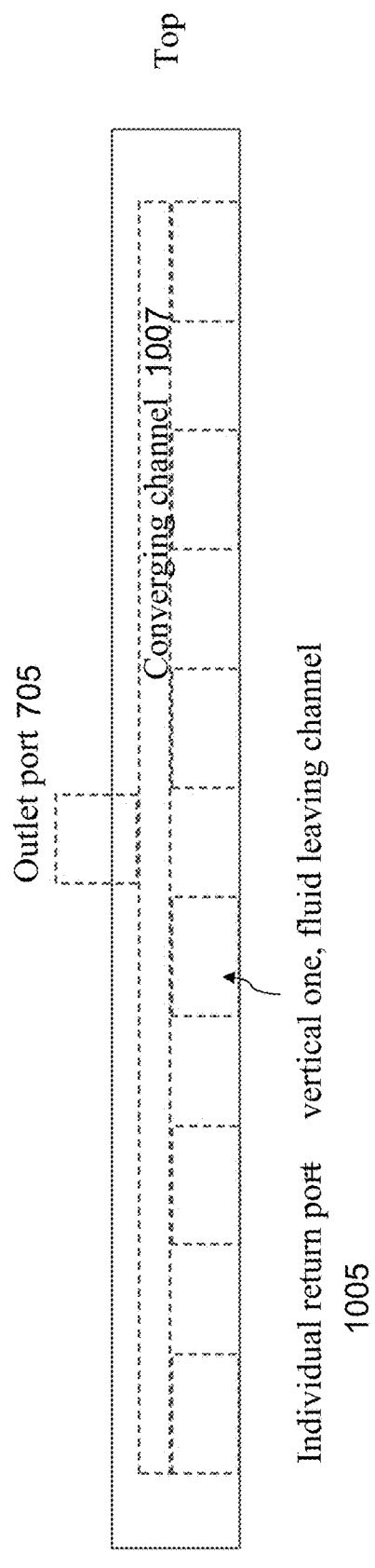
FIG. 10 shows a side view of a part of the liquid cooling device of FIG. 8 showing vertical fluid return channels and the fluid outlet port on top of the vertical fluid return channels according to one embodiment.

FIG. 10 shows a side view of a part of the liquid cooling device 801 of FIG. 8 showing vertical fluid return channels 1005 and the fluid outlet port 705 on top of the vertical fluid return channels 1005 according to one embodiment. Each of the six sets of cooling channels has an individual return channel 1005 on top of the cooling channels to return the fluid leaving the cooling channels vertically. The individual return channel 1005 may also be referred to as individual return port or vertical return channel. A converging channel 1007 collects the fluid exiting from the six individual return channels 1005 for transport to fluid outlet port 705 that is located on top of converging channel 1007.

Vertical return channels 1005, converging channel 1007, and fluid outlet port 705 may be fabricated on a top frame of liquid cooling device 801. The liquid distribution loop thus delivers fluid from fluid inlet port 703 on one side of cooling channels 403 into fluid entering channel 803, through the fin channels or micro-channels of the sets of cooling channels 403 on the bottom frame shown in FIG. 9, vertically through individual return channel 1005 of each set of cooling channels 403, through converging channel 1007, and out to fluid outlet port 705 on the top frame. In one embodiment, converging channel 1007 and fluid outlet port 705 may be fabricated on the top frame and vertical return channels 1005 may be fabricated on a different frame.

Figure 11:
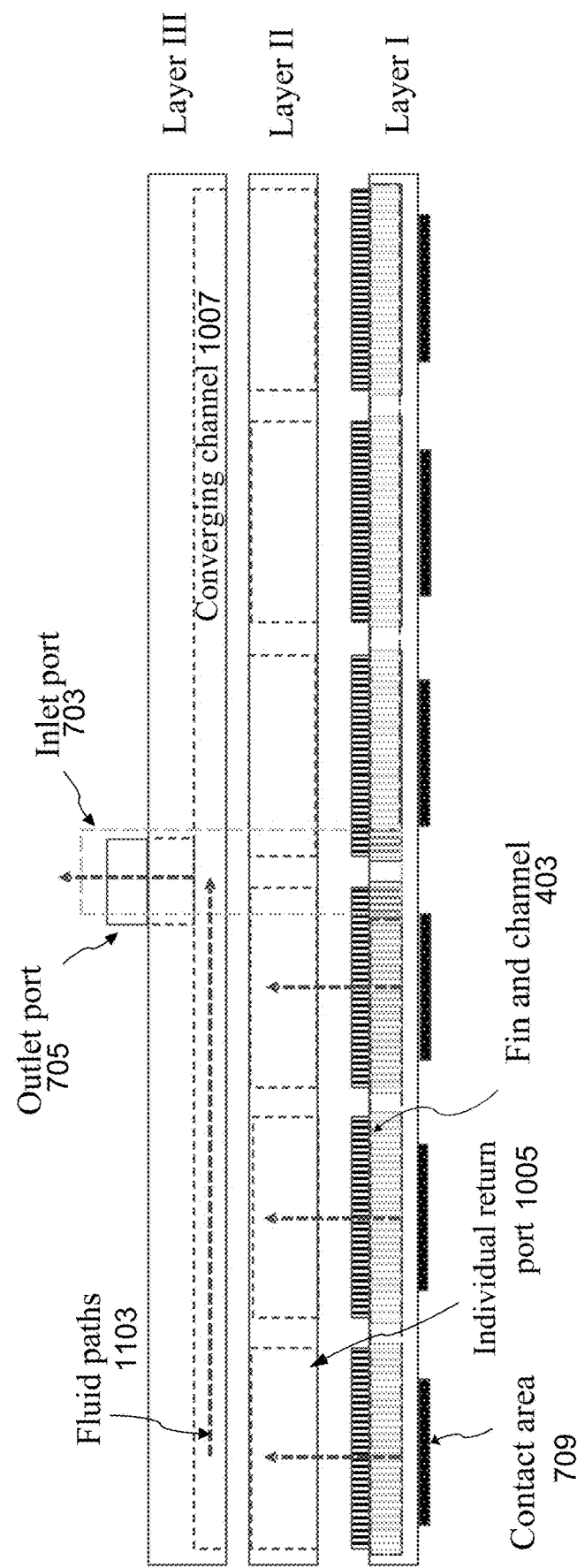
FIG. 11 shows an exploded side view of the complete assembly of the liquid cooling device of FIG. 8 showing the fluid flow paths according to one embodiment.

FIG. 11 shows an exploded side view of the complete assembly of the liquid cooling device 801 of FIG. 8 showing the fluid flow paths 103 according to one embodiment. The liquid cooling device 801 may be assembled from three layers or frames. Layer 1 or the bottom frame may include the sets of cooling channels 403, contact area 709 that may contain cold plates to contact the electronic components to be cooled, and the inlet channel including the fluid entering channel 803 that supplies fluid to the cooling channels 403. Layer 2 or the middle frame may include the individual vertical return channel 1005 for each of the set of cooling channels 403. Layer 3 or the top frame may include converging channel 1007 that collects the fluid from the individual vertical return channel 1005 and the fluid outlet port 705. Fluid inlet port 703 may run down one side of cooling channel 403 through all three layers to supply cooling liquid to the inlet channel of layer 1.

As mentioned, fluid supplied from fluid inlet port 703 flows downward into fluid entering channel 803 of layer 1, absorbs heat generated by the electronic components through contact area 709, flows through the fin channels or micro-channels of the sets of cooling channels 403, transports upward through individual vertical return channel 1005 associated with each set of cooling channels 403 of layer 2, converges in converging channel 1007 of layer 3, and exits through fluid outlet port 705. In one embodiment, the layers may be flipped so that layer 1 containing fluid entering channel 803, cold plates 303, and cooling channels 403 may be the top layer. Layer 2 containing individual vertical return channel 1005 remains the middle layer. Layer 3 containing converging channel 1007 may be the bottom layer. Fluid inlet port 703 may sit on top of layer 1 and fluid outlet port 705 may run up one side of cooling channel 403 through all three layers to return fluid from converging channel 1007.

Figure 12:
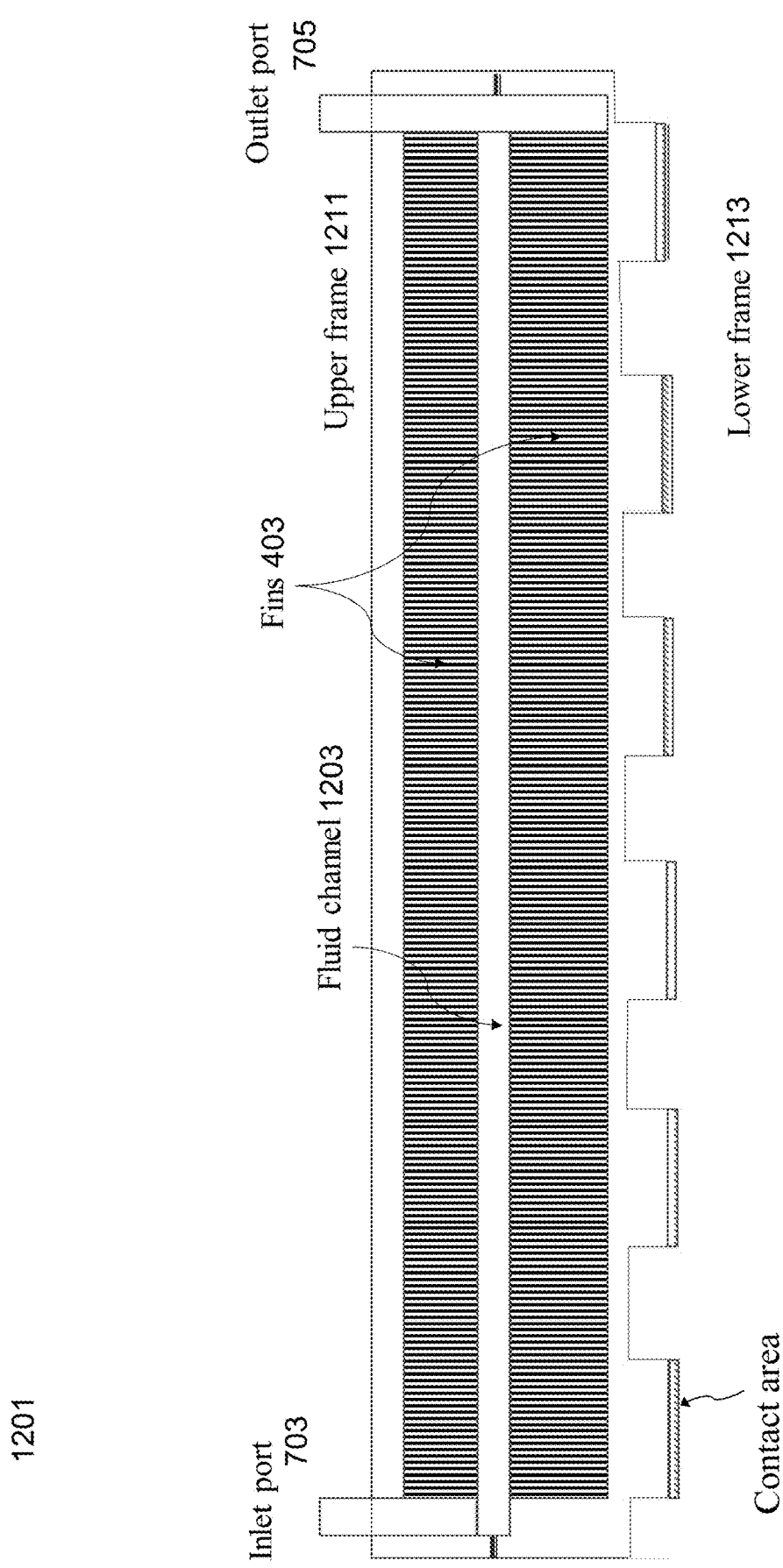
FIG. 12 shows a side view of a liquid cooling device in another configuration with the inlet channel in a middle section sandwiched between two layers of multiple cooling channels according to one embodiment.

FIG. 12 shows a side view of a liquid cooling device 1201 in another configuration with the inlet channel in a middle section sandwiched between two layers of multiple cooling channels 403 according to one embodiment. The liquid cooling device 1201 is assembled from an upper frame 1211 and a lower frame 1213. Upper frame 1211 may contain fluid inlet port 703 and one half of the fin channels constituting cooling channels 403. Lower frame 1213 may contain contact area 709 and the other half of the fin channels. Fluid outlet port 705 may connect to lower frame 1213 only on a side of cooling channels 403 opposite from fluid inlet port 703. The inlet channel between upper frame 1211 and lower frame 1213 may include a fluid channel 1203 that connects with fluid inlet port 703 to supply fluid to the two halves of the fin channels.

Fluid supplied from fluid inlet port 703 flows into fluid channel 1203, through the fins channels of cooling channel 403 on both upper frame 1211 and lower frame 1213, collects in lower frame 1213 to absorb heat generated by the electronic components via cold plates in contact area 709, and exists through fluid outlet port 705.

Figure 13:
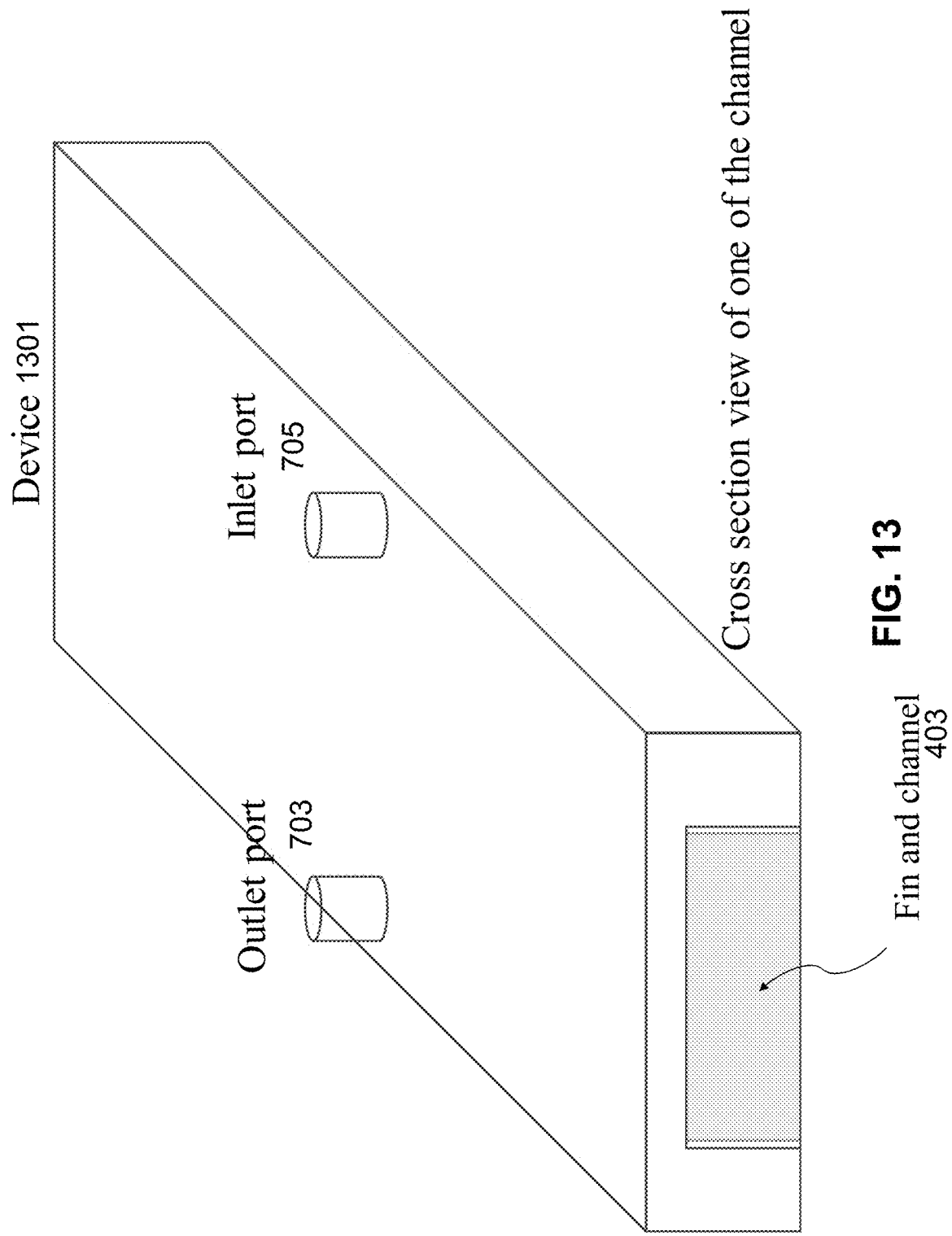
FIG. 13 shows a perspective view of a liquid cooling device with multiple cooling channels showing the fluid inlet port and outlet port according to one embodiment.

FIG. 13 shows a perspective view of a liquid cooling device 1301 with multiple cooling channels 403 showing the fluid inlet port 703 and fluid outlet port 705 according to one embodiment. Liquid cooling device 1301 may be assembled from multiple frames or layers containing the inlet channel and outlet channel of the fluid distribution loop as discussed. FIG. 13 may represent a perspective view of liquid cooling device 501 of FIG. 5, liquid cooling device 601 of FIG. 6, liquid cooling device 701 of FIG. 7, liquid cooling device 801 of FIGS. 8, 9, 10, and 11, or liquid cooling device 1201 of FIG. 12.

Figure 14A:
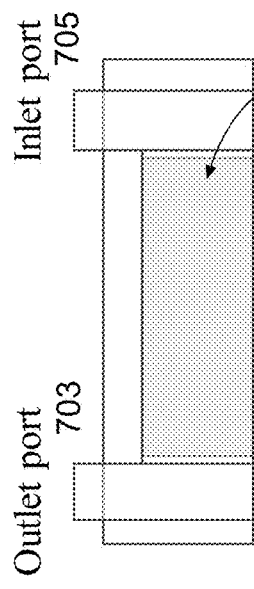
FIG. 14A shows a side cross-sectional view of one configuration of a liquid cooling device with multiple cooling channels showing the fluid inlet port on one side and the fluid outlet port on the opposite side of the multiple cooling channels according to one embodiment.

FIG. 14A shows a side cross-sectional view of one configuration of a liquid cooling device with multiple cooling channels 403 showing the fluid inlet port 703 on one side and the fluid outlet port 705 on the opposite side of the multiple cooling channels 403 according to one embodiment. FIG. 14A may represent a side cross-sectional view of liquid cooling device 601 of FIG. 6, liquid cooling device 701 of FIG. 7, or liquid cooling device 1201 of FIG. 12.

Figure 14B:
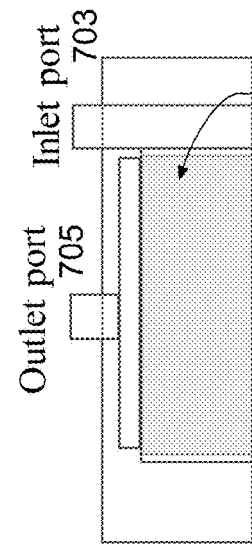
FIG. 14B shows a side cross-sectional view of another configuration of a liquid cooling device with multiple cooling channels showing the fluid inlet port on one side and the fluid outlet port on top of the multiple cooling channels according to one embodiment.

FIG. 14B shows a side cross-sectional view of another configuration of a liquid cooling device with multiple cooling channels 403 showing the fluid inlet port 703 on one side and the fluid outlet port 705 on top of the multiple cooling channels 403 according to one embodiment. FIG. 14B may represent a side cross-sectional view of liquid cooling device 801 of FIGS. 8, 9, 10, and 11.

Figure 14C:
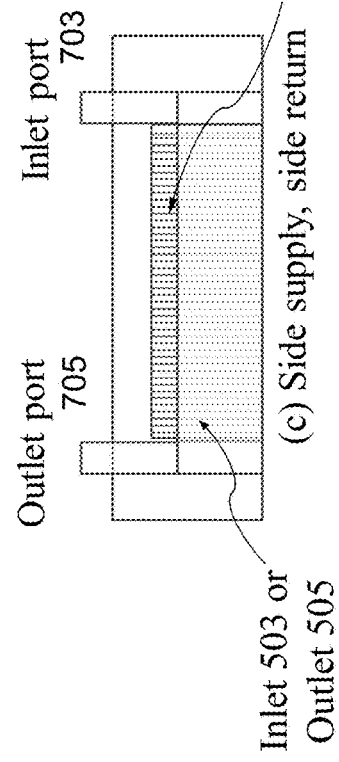
FIG. 14C shows a side cross-sectional view of another configuration of a liquid cooling device with multiple cooling channels showing the fluid inlet port on one side and the fluid outlet port on the opposite side of the multiple cooling channels with part of the inlet or outlet channel for the cooling channels positioned perpendicular to the fin channels of the cooling channels according to one embodiment.

FIG. 14C shows a side cross-sectional view of another configuration of a liquid cooling device with multiple cooling channels 403 showing the fluid inlet port 703 on one side and the fluid outlet port 705 on the opposite side of the multiple cooling channels 403 with part of the inlet or outlet channel for the cooling channels positioned perpendicular to the fin channels of the cooling channels according to one embodiment. FIG. 14C may represent a side cross-sectional view of liquid cooling device 501 of FIG. 5.

Various configurations, layouts, and assemblies of the liquid cooling device as described enables the fluid distribution network to be optimized for electronic components or systems with different thermal profiles. The integrated design of the fluid inlet port 703, fluid outlet port 705, inlet channel, outlet channel, and cooling channels 403 of the fluid distribution network provide efficient liquid cooling of multiple high-density electronics packaged in a small footprint, such as multiple high-density chips on the same board, increasing cooing performance, reliability, efficiency, scalability, and lowering cost to meet the thermal management needs of high performance electronic components in complex packaging environment.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A liquid cooling apparatus of a data center, comprising:
a plurality of cooling channels to transport a liquid;
a supply channel connected to the plurality of cooling channels to distribute the liquid to the plurality of cooling channels;
a return channel connected to the plurality of cooling channels to collect the liquid from the plurality of cooling channels;
a fluid inlet port connected to the supply channel to supply the liquid from a cooling liquid source to the supply channel;
a fluid outlet port connected to the return channel to return the liquid to the cooling liquid source; and
a plurality of cold plates configured to contact a plurality of electronic components to remove heat generated by the electronic components through the liquid, wherein the plurality of cooling channels, the supply channel, the return channel, the fluid inlet port, the fluid outlet port, and the plurality of cold plates are integrated onto a plurality of stacked frames and wherein the plurality of cooling channels are distributed over the plurality of stacked frames.

2. The liquid cooling apparatus of claim 1, wherein the fluid inlet port is configured to run through the plurality of stacked frames at a first side of the plurality of cooling channels to supply the liquid to the supply channel, and wherein the fluid outlet port is configured to run through the plurality of stacked frame at a second side opposite the first side of the plurality of cooling channels to return the liquid.

3. The liquid cooling apparatus of claim 2, wherein the supply channel distributes the liquid to the plurality of cooling channels from the first side of the plurality of cooling channels, and wherein the return channel collects the liquid from the plurality of cooling channels from the second side of the plurality of cooling channels.

4. The liquid cooling apparatus of claim 1, wherein the fluid inlet port is configured to run through the plurality of stacked frames at a first side of the plurality of cooling channels to supply the liquid to the supply channel, and wherein the fluid outlet port is configured to return the liquid from above the plurality of cooling channels.

5. The liquid cooling apparatus of claim 4, wherein the supply channel distributes the liquid to the plurality of cooling channels from the first side of the plurality of cooling channels.

6. The liquid cooling apparatus of claim 4, wherein the return channel comprises:
a plurality of return channels stacked above the plurality of cooling channels to collect the liquid from the plurality of cooling channels; and
a converging channel stacked above the plurality of return channels to collect the liquid from the plurality of return channels,
and wherein the fluid outlet port is configured above the converging channel to return the liquid.

7. The liquid cooling apparatus of claim 6, wherein a first frame of the plurality of stacked frames comprises the plurality of cooling channels and the plurality of cold plates, a second frame of the plurality of stacked frames comprises the plurality of return channels, and wherein a third frame of the plurality of stacked frames comprises the converging channel and the fluid outlet port.

8. The liquid cooling apparatus of claim 1, wherein the plurality of cooling channels and the plurality of cold plates are integrated into a first frame of the plurality of stacked frames, and wherein one or more of the supply channel, the return channel, the fluid inlet port, or the fluid outlet port are integrated into a second frame of the plurality of stacked frames.

9. The liquid cooling apparatus of claim 1, wherein the supply channel comprises a trapezoid shape configured to evenly distribute the liquid to the plurality of cooling channels.

10. A data center system, comprising:
a plurality of electronic racks, each electronic racks containing a plurality of server chassis and each server chassis corresponding to one or more servers, wherein each server chassis comprises:
a plurality of cooling channels to transport a liquid;
a supply channel connected to the plurality of cooling channels to distribute the liquid to the plurality of cooling channels;
a return channel connected to the plurality of cooling channels to collect the liquid from the plurality of cooling channels;
a fluid inlet port connected to the supply channel to supply the liquid from a cooling liquid source to the supply channel;
a fluid outlet port connected to the return channel to return the liquid to the cooling liquid source; and
a plurality of cold plates configured to contact a plurality of electronic components of the one or more servers to remove heat generated by the electronic components through the liquid, wherein the plurality of cooling channels, the supply channel, the return channel, the fluid inlet port, the fluid outlet port, and the plurality of cold plates are integrated onto a plurality of stacked frames.

11. The data center system of claim 10, wherein the fluid inlet port is configured to run through the plurality of stacked frames at a first side of the plurality of cooling channels to supply the liquid to the supply channel, and wherein the fluid outlet port is configured to run through the plurality of stacked frame at a second side opposite the first side of the plurality of cooling channels to return the liquid.

12. The data center system of claim 11, wherein the supply channel distributes the liquid to the plurality of cooling channels from the first side of the plurality of cooling channels, and wherein the return channel collects the liquid from the plurality of cooling channels from the second side of the plurality of cooling channels.

13. The data center system of claim 10, wherein the fluid inlet port is configured to run through the plurality of stacked frames at a first side of the plurality of cooling channels to supply the liquid to the supply channel, and wherein the fluid outlet port is configured to return the liquid from above the plurality of cooling channels.

14. The data center system of claim 13, wherein the supply channel distributes the liquid to the plurality of cooling channels from the first side of the plurality of cooling channels.

15. The data center system of claim 13, wherein the return channel comprises:
a plurality of return channels stacked above the plurality of cooling channels to collect the liquid from the plurality of cooling channels; and a converging channel stacked above the plurality of return channels to collect the liquid from the plurality of return channels, and wherein the fluid outlet port is configured above the converging channel to return the liquid.

16. The data center system of claim 15, wherein a first frame of the plurality of stacked frames comprises the plurality of cooling channels and the plurality of cold plates, a second frame of the plurality of stacked frames comprises the plurality of return channels, and wherein a third frame of the plurality of stacked frames comprises the converging channel and the fluid outlet port.

17. The data center system of claim 10, wherein the plurality of cooling channels and the plurality of cold plates are integrated into a first frame of the plurality of stacked frames, and wherein one or more of the supply channel, the return channel, the fluid inlet port, or the fluid outlet port are integrated into a second frame of the plurality of stacked frames.

18. The data center system of claim 10, wherein the plurality of cooling channels are distributed over a plurality of the stacked frames.

19. The data center system of claim 10, wherein the supply channel comprises a trapezoid shape configured to evenly distribute the liquid to the plurality of cooling channels.

* * * * *